(12) United States Patent
Dong

(10) Patent No.: US 6,338,633 B1
(45) Date of Patent: Jan. 15, 2002

(54) ELECTRICAL CONNECTOR WITH IMPROVED CONTACTS

(75) Inventor: Shun Chi Dong, San Jose, CA (US)

(73) Assignee: Hon Hai Precision Ind. Co., Ltd., Taipei Hsien (TW)

(*) Notice: Subject to any disclaimer, the term of this patent is extended or adjusted under 35 U.S.C. 154(b) by 0 days.

(21) Appl. No.: 09/639,703

(22) Filed: Aug. 14, 2000

(51) Int. Cl.⁷ .................................................. H01R 4/02
(52) U.S. Cl. ......................................................... 439/83
(58) Field of Search ............................. 439/74, 83, 876

(56) References Cited

U.S. PATENT DOCUMENTS

| | | | | |
|---|---|---|---|---|
| 5,823,801 A | * | 10/1998 | Elkhatib | 439/83 |
| 6,099,326 A | * | 10/1998 | Lin | 439/83 |
| 5,836,773 A | * | 11/1998 | McHugh et al. | 439/74 |
| 5,931,689 A | * | 8/1999 | Patel | 439/74 |
| 6,019,613 A | * | 2/2000 | Kataoka et al. | 439/83 |
| 6,036,504 A | * | 3/2000 | McHugh et al. | 439/74 |

* cited by examiner

*Primary Examiner*—Gary F. Paumen
(74) *Attorney, Agent, or Firm*—Wei Te Chung

(57) ABSTRACT

An electrical connector includes a plurality of contacts and an insulative housing defining a plurality of cavities therethrough for receiving the contacts therein. Each contact includes a soldering tail at an end thereof, a contacting portion at an opposite end thereof and a transition portion between the soldering tail and the contacting portion. A twist portion is provided between the transition portion and the soldering tail for conveniently forming a wide contacting portion, while at the same time forming wide gaps between adjacent soldering tails. The wide contacting portions provide reliable contact with mating contacts of a mating connector. The wide gaps prevent unwanted bridging of the soldering tails during the soldering process. The housing comprises a main body and a pair of slots respectively defined at opposite ends of the main body. A pair of metal ears is respectively secured in the slots for attaching the housing onto a PCB.

1 Claim, 4 Drawing Sheets

ELECTRICAL CONNECTOR WITH IMPROVED CONTACTS

FIELD OF THE INVENTION

The present invention relates to an electrical connector, and in particular to a board-to-board connector having contacts which can prevent solder bridging of the contacts during the soldering process.

BACKGROUND OF THE INVENTION

Board-to-board connectors are popularly used in the computer industry. There is an ongoing trend to minimize the size of computers. Thus manufacturers want to reduce the space occupied by connectors within a computer. Surface Mount Technology (SMT) and high density connectors (with closely spaced contacts, for example, 0.5 mm pitch) have been developed accordingly. An SMT, high density, board-to-board connector is illustrated in U.S. Pat. No. 5,836,773. FIG. 4 is an illustration of a portion of the connector of the prior patent, wherein a contact 48 includes a tail section 50 for soldering the contact 48 onto a printed circuit board (PCB) and a vertical main body 52 for being retainably received within a corresponding passage 42 in a housing 40. The main body 52 is bent to extend perpendicularly from an end of the tail section 50. The width of the main body 52 is about equal to the width of the tail section 50.

The width of the main body 52 is required to guarantee reliable contact with an inserted contact of a mating connector (not shown). However, during manufacture of the connector, the tail section 50 with such width is prone to develop unwanted solder bridges between adjacent tail sections during the soldering process. This frequently results in short circuits, thereby damaging electrical devices connected with the mating connectors.

Therefore, improved contacts for use in a board-to-board connector is desired.

BRIEF SUMMARY OF THE INVENTION

A main object of the present invention is to provide an electrical connector having improved contacts which can effectively prevent unwanted solder bridges forming when the contacts are soldered onto a printed circuit board (PCB).

Another object of the present invention is to provide an electrical connector which is firmly secured to the PCB.

An electrical connector according to the present invention comprises a plurality of contacts and an insulative housing defining a plurality of cavities for receiving the contacts therein.

Each contact comprises a contacting portion formed at one end thereof, a soldering tail at an opposite end and a transition portion formed between the contacting portion and the soldering tail. A clearance with a first width is formed between adjacent contacting portions, while a gap with a second width is formed between adjacent soldering tails. A twist portion is provided between the soldering tail and the transition portion. A side face of the soldering tail is formed perpendicular to a top face of the transition portion, which would lie in a same plane before twisting. Accordingly, the contacting portion is relatively wide for reliably contacting a mating contact. Furthermore, the gap between adjacent soldering tails is sufficiently wide to prevent bridging during the soldering process. A pair of metal ears is respectively retained at opposite sides of the housing for reliably attaching the connector to the PCB.

Other objects, advantages and novel features of the invention will become more apparent from the following detailed description when taken in conjunction with the accompanying drawings.

DETAILED DESCRIPTION OF INVENTION

Figure 2:
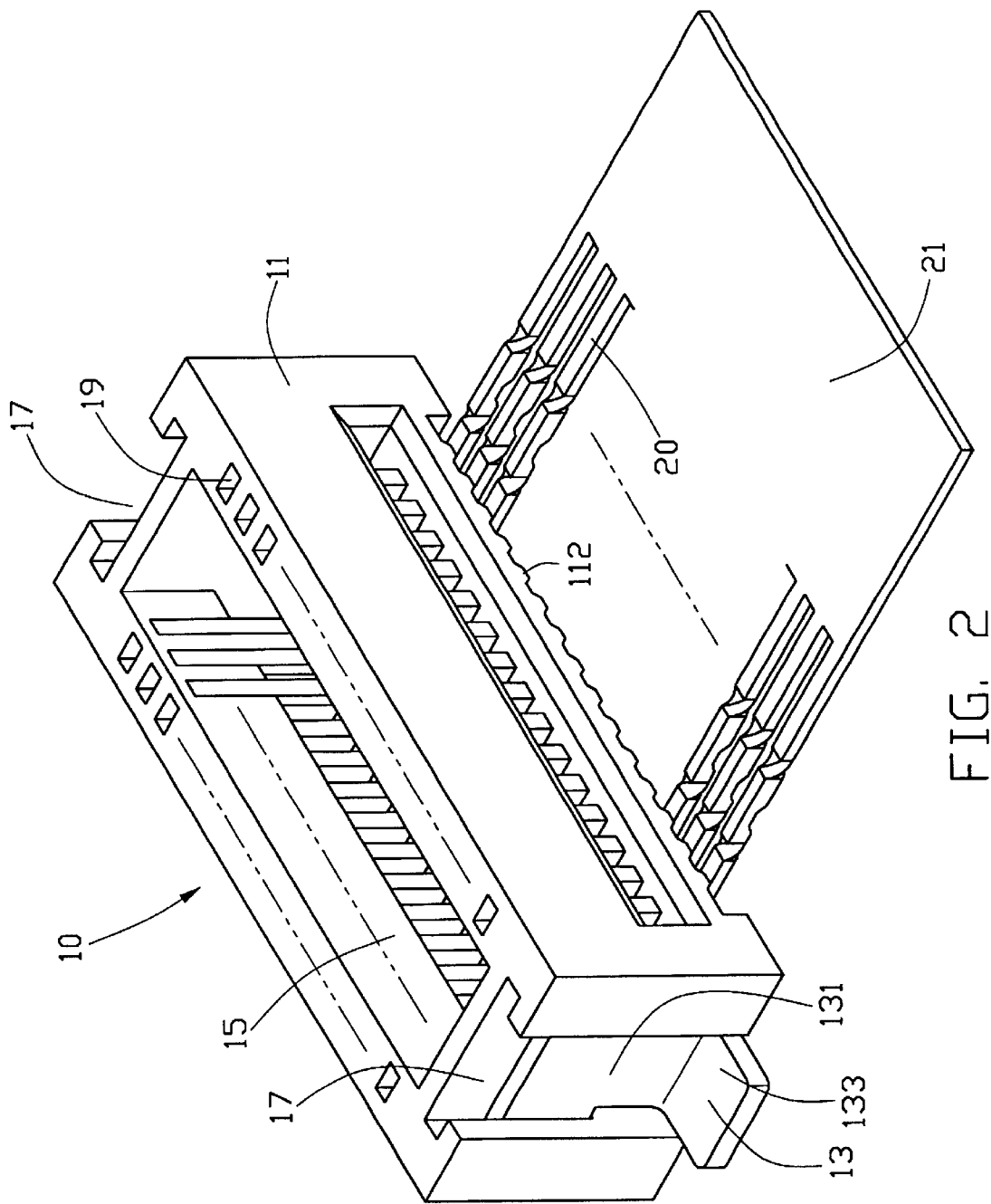
FIG. 2 is a perspective view of an electrical connector in accordance with the present invention at a pre-assembled stage, wherein only six contacts are shown.

Referring to FIG. 2, an electrical connector according to the present invention comprises an insulative housing 10 and a plurality of contacts 20 received in the housing 10.

Figure 1:
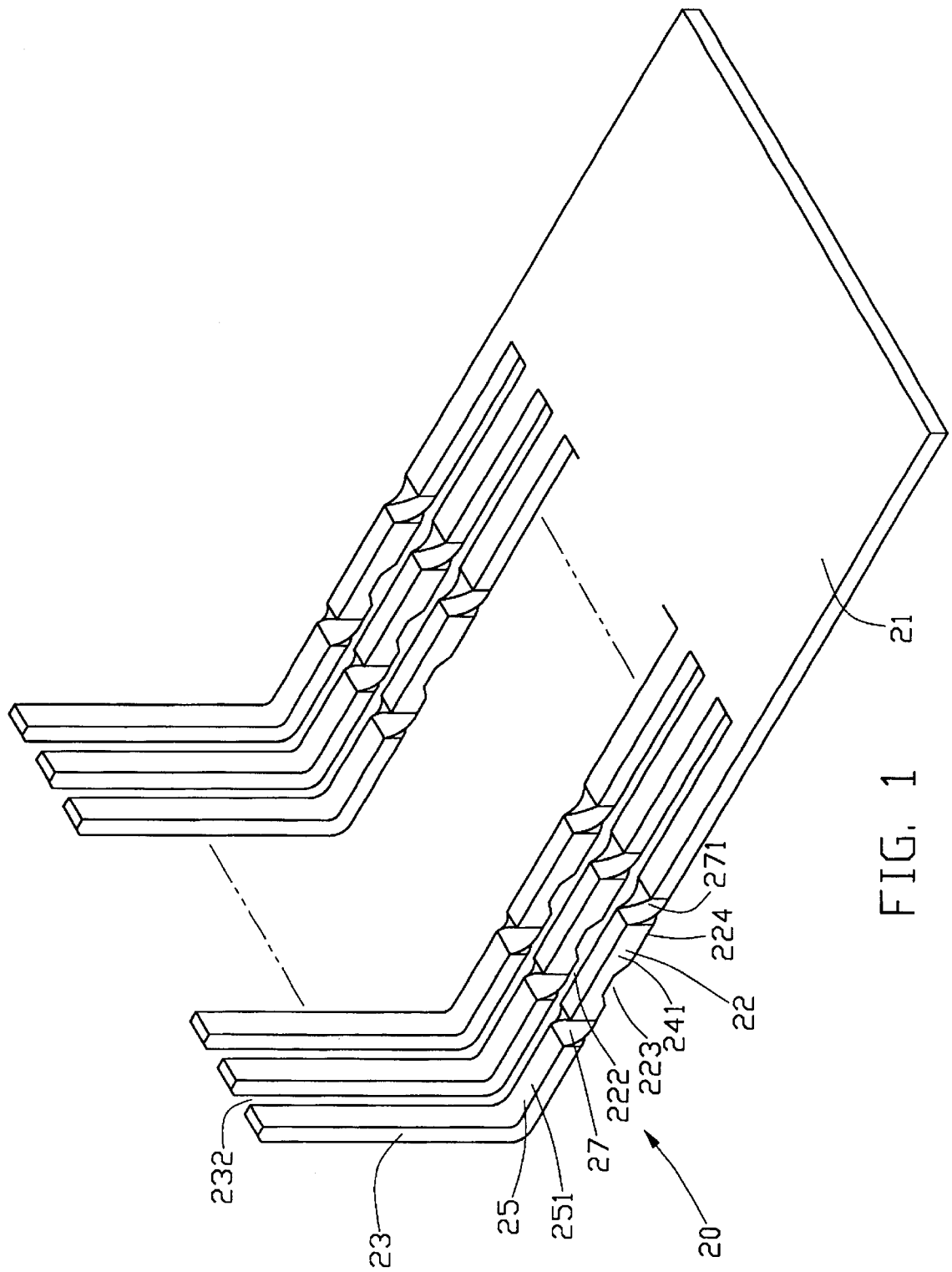
FIG. 1 is an enlarged view of a contact blank in accordance with the present invention.

Referring to FIG. 1, each contact 20 comprises a contacting portion 23 at one end thereof for electrically connecting with a mating contact (not shown), a soldering tail 22 at an opposite end thereof for soldering the contact 20 onto a PCB (not shown), and a transition portion 25 between the contacting portion 23 and the soldering tail 22.

The contacts 20 are spaced equidistantly from each other. A clearance 232 with a first width is formed between adjacent contacting portions 23, while a gap 222 with a second width is formed between two adjacent soldering tails 22. Each contact 20 has an end jointing to a transverse stamping carrier 21 for facilitating the mounting process. A groove 223 is defined in a bottom surface of the soldering tail 22 of each contact 20.

A twist portion 27 is formed between the soldering tail 22 and the transition portion 25. A side face 241 of the soldering tail 22 and a top face 251 of the transition portion 25 are formed in a same plane before the twisting process. Accordingly, the transition portion 25 is wider than the soldering tail 22. The contacting portion 23 perpendicularly extends upward from an end of the transition portion 25 opposite to the soldering tail 22. The contacting portion 23 is also wider than the soldering tail 22. Therefore, the first width of the clearance 232 between adjacent contacting portions 23 is smaller than the second width of the gap 222 between adjacent soldering tails 22. Thus, the contacting portion 23 possesses a flat and substantially wide configuration for reliably contacting a corresponding inserted contact of a mating connector (not shown). Furthermore, the gap 222 between the soldering tails 22 is sufficiently wide to prevent bridging during the soldering process. Preferably, the contact 20 forms a twist portion 271 between the soldering tail 22 and the carrier 21.

Figure 3:
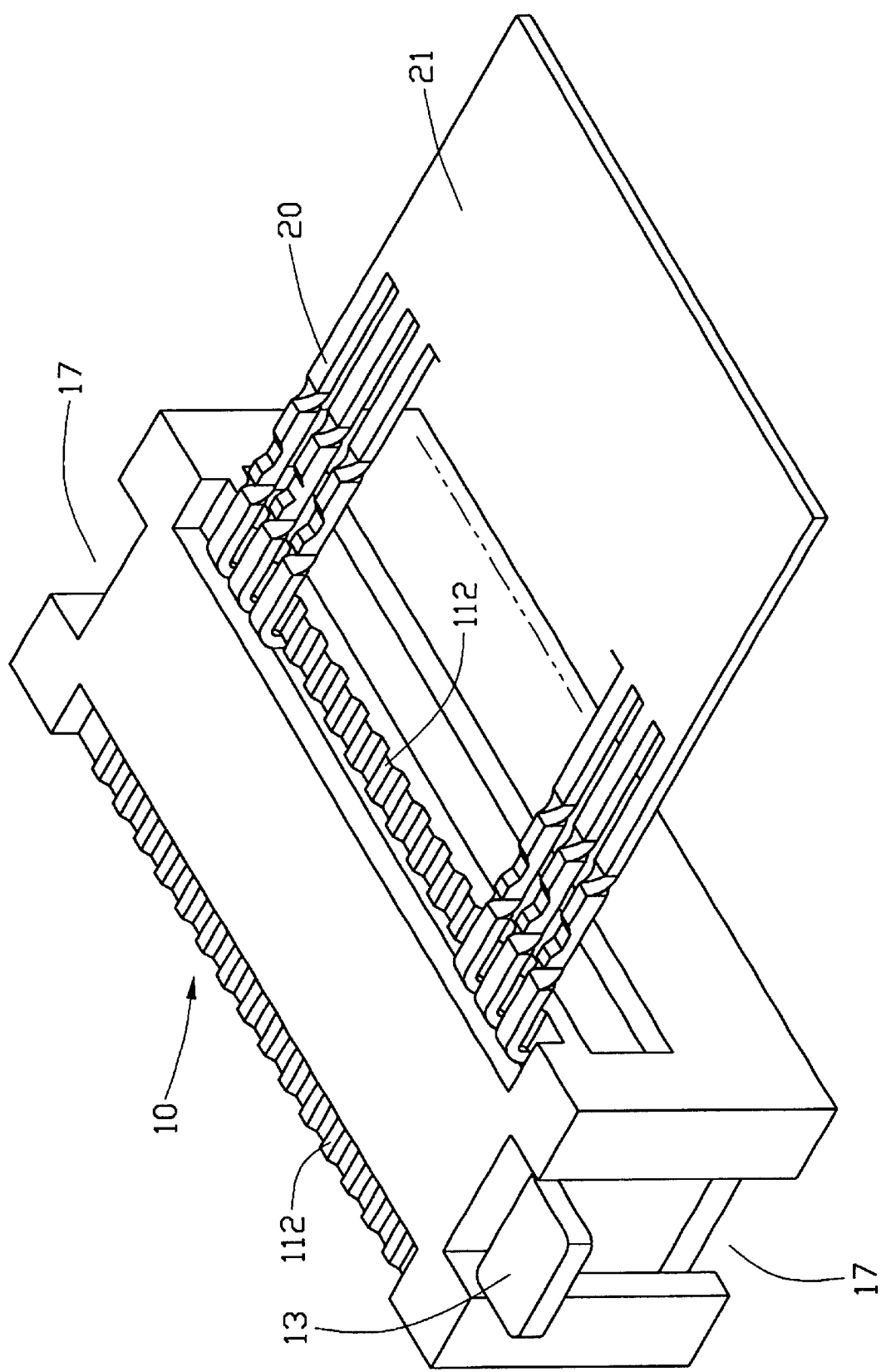
FIG. 3 is the connector of FIG. 2 taken from another aspect.
Figure 4:
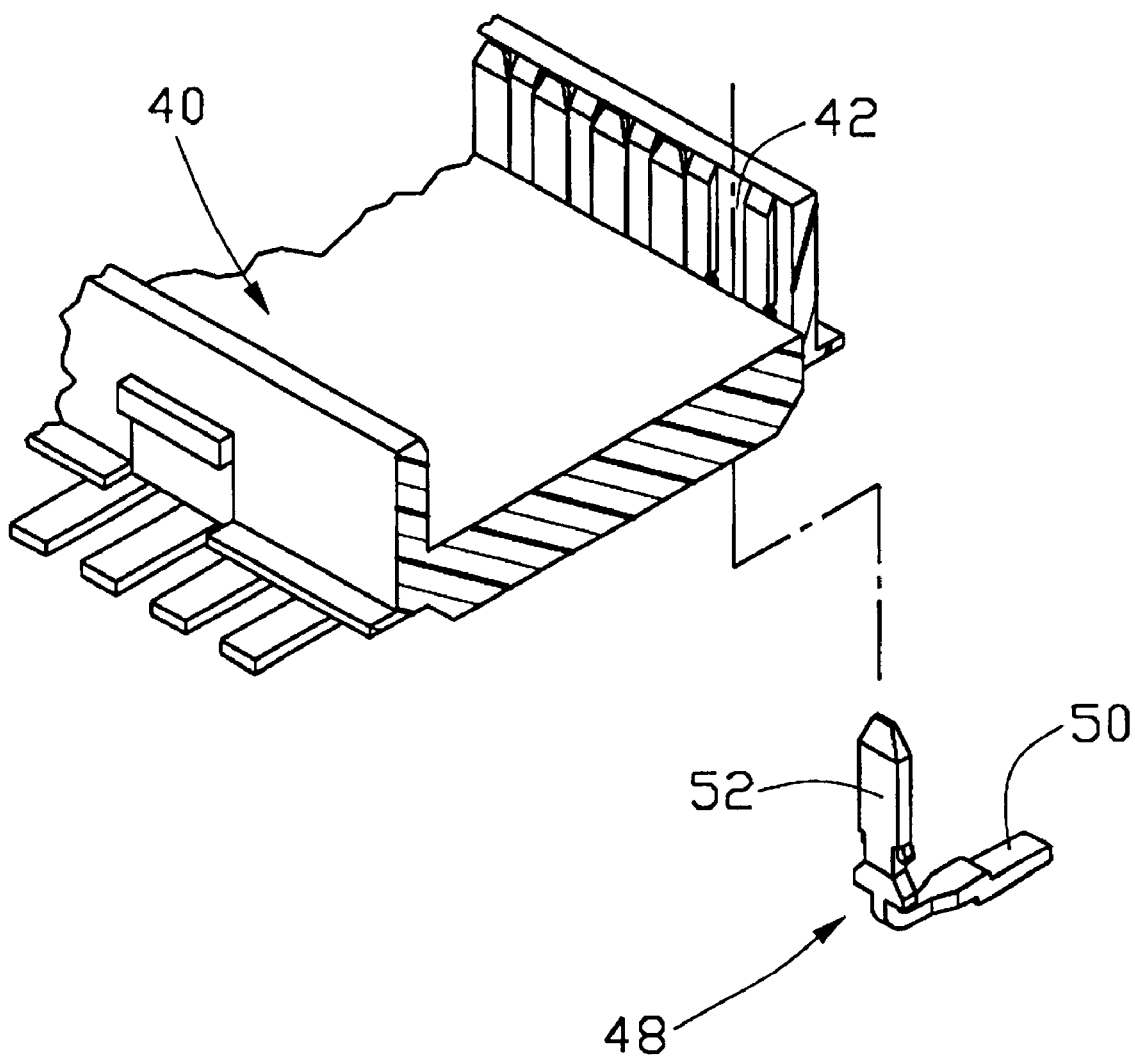
FIG. 4 is a perspective view of a part of a conventional board-to-board connector from which contacts have been removed, and wherein a contact is separately shown.

Referring to FIGS. 2 and 3, the housing 10 includes a substantially rectangular main body 11. The main body 11 defines a rectangular opening 15 in a middle thereof for mating with a mating connector. The main body 11 defines a plurality of cavities 19 therethrough in communication with the opening 15, the cavities 19 being arrayed respectively along opposite sides thereof for receiving the contacts 20. A plurality of alternating protuberances 112 is provided on a bottom face of the main body 11, corresponding to the cavities 19.

A pair of T-shaped slots 17 is respectively defined at opposite ends of main body 11. An L-shaped metal ear 13 includes a planar retention plate 131 retained in the T-shaped slot 17 and a soldering plate 133 extending outwardly and perpendicularly from a bottom of the retention plate 131.

In assembly, the contacting portions 23 of the contacts 20 are respectively inserted into and extended through the corresponding cavities 19 from the bottom face of the housing 10, for contacting mating contacts of the mating connector. The top faces 251 of the transition portions 25 respectively abut against the corresponding protuberances 112 of the housing 10. The retention plates 131 are respectively retained in the T-shaped slots 17, and the soldering tails 22 and the soldering plates 133 are soldered onto the PCB to attach the connector to the PCB.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical connector which prevents bridging during an SMT soldering process, comprising:

an insulative housing defining a plurality of cavities therethrough; and a plurality of contacts each including an SMT-type soldering tail at one end thereof, a contacting portion at an opposite end thereof for electrically engaging with a complementary connector, a twist portion being provided between the soldering tail and the contact portion, a gap between two adjacent soldering tails of two contacts being larger than a gap between two adjacent contact portions of two contacts for preventing bridging;

wherein each contact further comprises a transition portion between the soldering tail and the contacting portion, and wherein the twist portion is located between the transition portion and the soldering tail;

wherein a top face of the transition portion is formed perpendicular to a side face of the soldering tail, the top face and the side face lying in a same plane prior to a twisting process, wherein the contacts are spaced equidistantly from each other;

wherein the contacts are joined to a transverse stamping carrier for facilitating the mounting process;

wherein each contact further comprises a twist portion between the soldering tail and the carrier;

wherein the contacting portion is substantially perpendicular to the transition portion, to extend into a corresponding cavity;

wherein the housing comprises a main body defining an opening in a middle thereof;

wherein a plurality of alternating protuberances is provided on a bottom face of the main body, the protuberances abutting against corresponding transition portions;

wherein a pair of T-shaped slots is defined at opposite ends of the main body;

wherein the housing further comprises a pair of metal ears at opposite ends thereof, and each metal ear has a retention plate secured in a corresponding slot;

wherein each metal ear has a soldering plate extending perpendicularly from an end of the retention plate for soldering onto the printed circuit board.

* * * * *